(12) United States Patent
Kapoor et al.

(10) Patent No.: US 6,741,122 B2
(45) Date of Patent: May 25, 2004

(54) ROUTING TECHNIQUE TO ADJUST CLOCK SKEW USING FRAMES AND PRONGS

(75) Inventors: Ashok K. Kapoor, Palo Alto, CA (US); Lei Lin, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/758,603

(22) Filed: Jan. 12, 2001

(65) Prior Publication Data

US 2003/0034832 A1 Feb. 20, 2003

(51) Int. Cl.[7] ............................................. H01L 25/00
(52) U.S. Cl. ...................... 327/564; 327/283; 327/290
(58) Field of Search .................................. 327/283, 284, 327/290, 564

(56) References Cited

U.S. PATENT DOCUMENTS 5,109,168 A  * 4/1992 Rusu ........................... 326/47
5,994,924 A  * 11/1999 Lee et al. ..................... 326/93

* cited by examiner

*Primary Examiner*—Kenneth B. Wells
(74) *Attorney, Agent, or Firm*—Sawyer Law Group LLP

(57) ABSTRACT

An improved method and design for adjusting clock skew in a wire trace is disclosed. Aspects of the invention include a corrugated pattern wire trace bracketed by a pair of parallel conducting wire frames with wire extensions projecting between the corrugations of the wire trace. The wire frames are connected to a voltage supply. The transmission properties of the wire trace, and thus the degree of clock skew associated with the wire trace, are affected by the number of wire extensions protruding between the corrugations, their degree of penetration, as well as other factors inherent in the design. The present design can achieve the same degree of clock skew with a smaller surface area covered and with fewer resistive losses than with prior art designs.

27 Claims, 1 Drawing Sheet

ROUTING TECHNIQUE TO ADJUST CLOCK SKEW USING FRAMES AND PRONGS

BACKGROUND OF THE INVENTION

1. Field of Invention

The present invention relates generally to adjusting clock skew.

2. Description of Related Art

Clock skew is a well-known problem, in particular with CMOS switching logic, when there is a difference in propagation delay or phase between two or more signals transmitted along a set of signal lines in parallel, or with a single clock signal transmitted along a long wire where there is transmission delay, e.g., if the clock signal triggers a plurality of rising-edge circuits, one circuit may undesirably react to the clock signal at a different time from another circuit.

To counteract and adjust clock skew, it is known in the prior art to vary the transmission characteristics of a wire trace, such as varying the capacitance and/or resistance of the wire by changing its physical shape, typically by zig-zagging the wire so that a transmission signal along the wire has to traverse a longer distance and thus the transmission delay may be varied according to the length of the wire. Thus, as shown in FIG. 1 (PRIOR ART), a wire trace 10, having a first endpoint A and a second endpoint B, has a zigzag or corrugated repeating pattern, in an attempt to lengthen the wire trace from the shape of a straight line between A and B. In this manner the propagation delay of a transmission signal may be varied by varying the length of the wire trace between A and B; the longer the wire, the greater the delay. By adjusting the length of the wire an optimal transmission delay may be devised between points A and B.

The problem with the prior art technique of adjusting clock delay as shown in FIG. 1 (PRIOR ART), compared with the present invention as disclosed herein, is that it is believed there are more resistive losses in the prior art technique of FIG. 1 (PRIOR ART) than with the present invention, and the surface area covered by the wire of FIG. 1 (PRIOR ART) is greater than with the present invention, for the same degree of delay. Furthermore, the prior art technique of FIG. 1 (PRIOR ART) is not as readily adjustable as the present invention; the propagation delay in the FIG. 1 (PRIOR ART) design is adjusted only by varying the length of the wire between A and B, and, once this length is fixed, the propagation delay is also fixed.

SUMMARY OF THE INVENTION

An aspect of the present invention is to provide a routing design for a wire trace that will achieve the same adjustment to clock skew as in prior art techniques but will have fewer resistive losses and need a smaller area.

Another aspect of the present invention is for a routing design that is relatively easily adjustable to achieve any given propagation delay.

The above described features and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings.

DETAILED DESCRIPTION OF THE PREFERRED EMBODIMENTS

Figure 2:
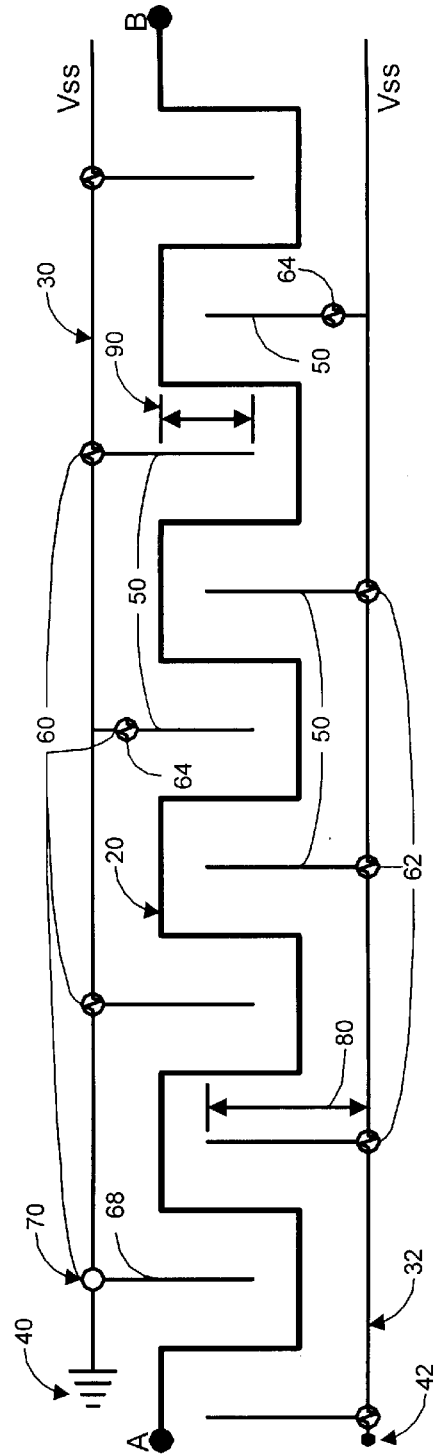
FIG. 2 is a top view of a preferred embodiment of the present invention.

Disclosed herein is a detailed description of the best presently known mode of carrying out the invention. This description is not to be taken in a limiting sense, but is made merely for the purpose of illustrating the general principles of the invention. The section titles and overall organization of the present detailed description are not intended to limit the present invention. Turning now to FIG. 2, there is shown a preferred embodiment of the present invention. There is shown a wire trace, conductive line, wire or pathway 20 on a printed circuit board or chip that allows an electricity to flow between points A and B. It is desired to change the skew, that is, the timing and/or phase of a transmission signal between A and B, such as a clock signal, when compared to a previous signal.

To change the skew, the present invention employs a number of novel features. First, wire trace 20 is formed into zigzags, corrugations or a non-linear geometry, as shown in FIG. 2, that lengthens the wire trace when compared to a straight line between points A and B. Next, the capacitance, and/or resistance, and/or impedance of the wire (generally, the transmission characteristics of the wire) are changed by proximity to a conductor and voltage source, in a pair of parallel conductors, frames, wires or rails 30 and 32 that bracket the wire trace 20 on both sides horizontally as shown. Frames 30 and 32 are each connected to voltage sources Vss. Frames 30 and 32 may be grounded (e.g., 0 V) and/or tied to any DC voltage source at the endpoints 40 and 42.

Furthermore, at approximately right angles to the wire frames 30 and 32 are a series of vertically extending prongs or ground wire extensions 50, electrically connected to the frames 30 and 32 at connection points, switches or fuse points 60 and 62 for frames 30 and 32 respectively. As can be seen from FIG. 2, the prongs 50 extend into the repeating peaks and valleys of the corrugations without touching the corrugations of the wire trace 20, with the wire trace undulating through the prongs 50, which are orthogonal, like teeth to a comb, to the parallel pair of frames 30, 32.

The switches or fuse points 60, 62 of the frames 30, 32 are designed to enable one to selectively electrically connect the prongs to the frames, which changes the transmission characteristics of the wire trace 20, and thereby changes the skew. In general, the greater the number of ground wire extensions 50 connected to the frames, the greater the delay created in the wire trace.

The switches or fuse points may be designed to be employed at the intersection of the prongs 50 to the frames 30, 32, or, they may be offset from the intersection, such as shown by switches or fuse points 64. The significance of offsetting the switches 64 from the intersection is that if fuses 64 are switched OFF (or if the fuses 64 are left open), then the prong 50 attached to the switch or fuse 64 is electrically disconnected from the frames 30 or 32 without affecting any of the other prongs 50 on either side of the prong attached to switch or fuse 64.

Thus, by connecting the prongs to the frames by leaving the fuse intact (closed), or the switch ON, the capacitance of the entire wire trace 20 may be increased. Conversely, if one wishes to decrease the capacitance, one or more switches would be switched OFF or one or more fuses blown (open), thus removing electrical connection between the prongs 50 and one or both of the frames 30 and 32. Conceptually, a blown fuse or open switch is shown in FIG. 2 at fuse or switch 70, which disconnects the prong 68 from the frame 30, thereby changing the transmission characteristics of the wire trace 20 as compared to when the fuse or switch 70 is closed or switched ON. In general, any number of connection points 60 and 62 may be open to isolate the prongs 50 from the frames 30 and 32 and thereby adjustably change the transmission characteristics of the wire trace. Furthermore, the connection points 60 and 62 may be formed in series with the frame, such as being formed at the intersection of the frame and the prong, so that by opening the connection points (i.e., blowing a fuse or opening a switch comprising the connection point), the portion of the frame downstream from the voltage source Vss is electrically isolated from the rest of the frame (i.e., in FIG. 2, for the open switch 70, the electrically isolated part of the frame would correspond to any portion of the frame to the left of switch 70). In the alternative, as with the connection point switches or fuses 64, which are offset from the frame and disposed only on the prongs, blowing a fuse or opening a switch only electrically affects the prong attached to the connection point, and electrically isolates the prong from the frame it is attached to, but does not affect other prongs attached to the frame.

Another parameter that changes the transmission characteristics of the wire trace is the length of the prong, shown as length 80, and the length of penetration of the prong into the corrugated portion of the wire trace, shown as length 90 in FIG. 2. The capacitance increases with greater penetration.

Figure 1:
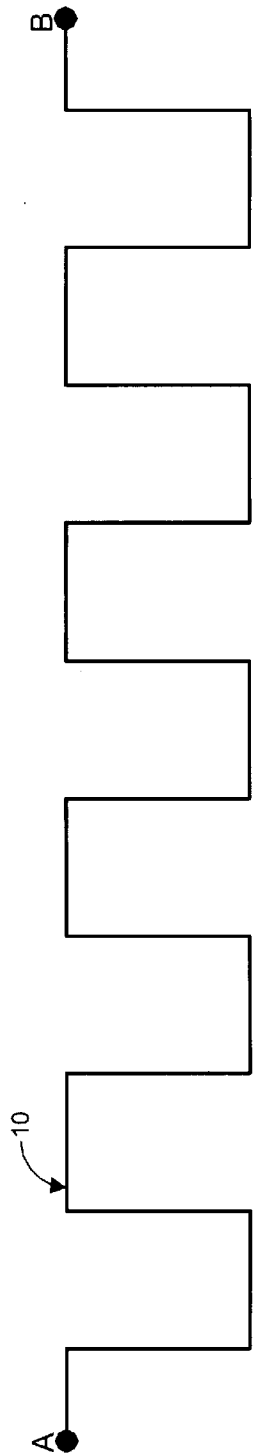
FIG. 1 (PRIOR ART) depicts a prior art design for adjusting clock skew in a wire trace.

By increasing the capacitance, a transmission signal may be delayed, and, if the signal is a clock signal, the degree of clock skew can be controlled, and in certain designs utilizing clock signal delay, the clock skew can be decreased. With the present invention, the transmission signal delay may be increased with a smaller surface area covered by the wire trace over prior art designs, such as shown in FIG. 1, thus the ratio of degree of delay per unit area is higher with the present invention design over prior art designs.

Though the preferred embodiments are disclosed in the present invention, alternative mechanisms may be employed without departing from the scope of the invention. For example, one skilled in the art using the teachings of the present invention could determine quantitatively exactly how the transmission characteristics are changed in a wire trace for any given transmission signal, by varying the physical properties of the present invention, such as the number and configuration of frames, prongs and the electrical connections between prongs, the length of the prongs, and the like. In addition, the novel physical design of the present invention inherently produces changes in the transmission characteristics that result in a smaller surface area wire trace interconnect between two points A and B over prior art designs. It is to be understood that while the invention has been described above in conjunction with preferred specific embodiments, the description and examples are intended to illustrate and not limit the scope of the invention, which is defined by the scope of the appended claims.

We claim:

1. An improved wire trace comprising:
    a wire trace;
    a conductor disposed alongside the trace;
    a plurality of wire extensions connected to said conductor and extending radially away from said conductor and towards said wire trace;
    wherein the transmission characteristics of the wire trace are affected by the conductor and said wire extensions.

2. The invention of claim 1, further comprising:
    a pair of conductors, the wire trace is disposed between the pair of conductors, and the pair of conductors are disposed substantially parallel to one another.

3. The invention of claim 1, further comprising:
    a plurality of prongs connected to the conductor, extending away from the conductor and towards the wire trace.

4. The invention of claim 3, further comprising:
    at least one connection point disposed to electrically connect at least one prong to the conductor.

5. The invention of claim 4, wherein:
    the connection point is disposed at the intersection of the prong to the conductor.

6. The invention of claim 4, wherein:
    the connection point is disposed on the prong, and operates to electrically connect and disconnect the prong from the conductor.

7. The invention of claim 4, further comprising:
    a plurality of connection points, each selected from the group consisting of switches or fuses, and are selectively turned ON or OFF to electrically connect and disconnect the prongs to the conductor, in order to vary the transmission characteristics of the wire trace.

8. The invention of claim 3, wherein:
    the wire trace is formed in a corrugated pattern having peaks and valleys, and the prongs extend into the peaks and valleys of the corrugated wire trace.

9. The invention of claim 8, wherein:
    the prongs are substantially orthogonal to the conductors the prongs are connected to, and the length of the prongs extending into the corrugated wire trace is varied in order to vary the transmission characteristics of the wire trace.

10. The invention of claim 1, further comprising:
    a voltage source connected to the conductor.

11. The invention of claim 10, wherein:
    the voltage source is connected to the conductor at one end, and the conductor is tied to another voltage level at the other end.

12. The invention of claim 10, further comprising:
    a plurality of prongs connected to the conductor, extending away from the conductor and towards the wire trace.

13. The invention of claim 12, wherein:
    the wire trace is formed in a corrugated pattern, and the prongs extend into the peaks and valleys of the corrugations, with the length of the prongs varied in order to vary the transmission characteristics of the wire trace.

14. The invention of claim 12, further comprising:
    at least one connection point disposed on the prong connected to the conductor, and electrically connecting the prong to the conductor.

15. The invention of claim 14, wherein:
    the wire trace is formed into a zigzag pattern;
    a plurality of connection points, the connection points selectively turned ON and OFF to electrically connect and disconnect the prongs to the conductor;
    the prongs are substantially orthogonal to the conductors and extend into the zigzags of the wire trace; and,
    the conductor comprises a pair of frames bracketing the wire trace.

16. A wire trace for improved skew control comprising:
a wire trace, said wire trace disposed in a non-linear pattern having corrugations;
a frame disposed alongside the length of said wire trace;
a plurality of wire extensions connected to said frame and extending radially away from said frame and towards said wire trace, said wire extensions disposed in-between said corrugations and not contacting said wire trace;
wherein the transmission characteristics of said wire trace are affected by the frame and said wire extensions.

17. The invention of claim 16, further comprising:
at least one fuse electrically connecting said frame to at least one of said wire extensions, said fuse turned ON for electrical connection between said frame and said wire extensions, and turned OFF for electrical isolation between said frame and said extensions;
wherein the transmission characteristics of said wire trace are affected by said fuse turned ON and OFF.

18. The invention of claim 17, further comprising:
a pair of said frames bracketing said wire trace;
wherein the length of said wire extensions and the number of said wire extensions are selected to affect the transmission characteristics of said wire trace.

19. The invention of claim 16, further comprising:
a pair of said frames bracketing said wire trace;
said plurality of wire extensions are substantially orthogonal to said pair of frames;
wherein the length of said wire extensions and the number of said wire extensions are selected to affect the transmission characteristics of said wire trace.

20. The invention of claim 16, further comprising:
a voltage source operatively connected to said frame at one end, and another end of said frame tied to a DC voltage source.

21. The invention of claim 20, wherein:
said DC voltage source is zero volts and comprises a ground.

22. A method of forming a wire trace on a die comprising the steps of:
forming a wire trace with a corrugated pattern on a die;
forming a wire frame running parallel to said wire trace;
forming a plurality of wire extensions radially projecting from the longitudinal axis of said wire frame and extending into the corrugations of said wire trace;
wherein the transmission characteristics of said wire trace are affected by said wire frame and said wire extensions.

23. The invention of claim 22, further comprising the steps of:
attaching fuses on said wire extensions and said wire frame to electrically connect said extensions to said frame;
biasing said wire frame at a predetermined voltage at one end of said frame with respect to the other end of said frame.

24. The invention of claim 23, further comprising the steps of:
selectively activating a predetermined number of said fuses to electrically disconnect said wire extensions from said wire frame, to vary the transmission properties of said wire trace.

25. The invention of claim 22, further comprising the steps of:
varying the length of said wire extensions and the degree of penetration into said corrugations of said wire trace, to vary the transmission properties of said wire trace.

26. The invention of claim 22, further comprising the steps of:
forming a pair of said wire frames bracketing said wire trace;
attaching switches on said wire extensions to electrically connect and disconnect said wire extensions to said wire frames.

27. The invention of claim 26, further comprising the steps of:
varying the number of switches that are turned ON to selectively change the transmission characteristics of the wire trace.

* * * * *